(12) United States Patent
Li

(10) Patent No.: US 11,424,745 B2
(45) Date of Patent: Aug. 23, 2022

(54) OSCILLATION CIRCUIT AND CLOCK GENERATION CIRCUIT

(71) Applicant: CHANGXIN MEMORY TECHNOLOGIES, INC., Hefei (CN)

(72) Inventor: Jianni Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/449,525

(22) Filed: Sep. 30, 2021

(65) Prior Publication Data
US 2022/0131545 A1 Apr. 28, 2022

Related U.S. Application Data

(63) Continuation of application No. PCT/CN2021/107942, filed on Jul. 22, 2021.

(30) Foreign Application Priority Data

Oct. 28, 2020 (CN) .......................... 202011173759.1

(51) Int. Cl.
H03L 1/02 (2006.01)
H03K 3/03 (2006.01)
H03K 3/011 (2006.01)

(52) U.S. Cl.
CPC ................ *H03L 1/02* (2013.01); *H03K 3/011* (2013.01); *H03K 3/0315* (2013.01)

(58) Field of Classification Search
CPC ......... H03L 1/02; H03K 3/011; H03K 3/0315
(Continued)

(56) References Cited

U.S. PATENT DOCUMENTS 7,015,739 B2    3/2006  Lee
7,321,269 B2    1/2008  Drake
(Continued)

FOREIGN PATENT DOCUMENTS

CN    1542861 A    11/2004
CN    1675836 A    9/2005
(Continued)

OTHER PUBLICATIONS

Kyu-hyoun Kim et al., "A 20-Gb/s 256-Mb DRAM with an inductor-less Quadrature PLL and a Cascaded Pre-emphasis Transmitter", in IEEE Journal of Solid-State Circuits, vol. 41, No. 1, Jan. 2006, pp. 127-134.
(Continued)

*Primary Examiner* — Arnold M Kinkead
(74) *Attorney, Agent, or Firm* — Syncoda LLC; Feng Ma

(57) ABSTRACT

An oscillation circuit includes: a power supply generation module and an oscillator. The power supply generation module is configured to generate a positive temperature coefficient voltage based on a positive temperature coefficient current; and the positive temperature coefficient voltage serves as a power supply of the oscillator. The oscillator includes: a first ring topological structure and a second ring topological structure. The first ring topological structure is formed by a plurality of first inverters connected end to end and configured to transmit an oscillation signal at a first transmission speed; and the second ring topological structure is formed by a plurality of second inverters connected end to end and configured to transmit the oscillation signal at a second transmission speed. The first ring topological structure is electrically connected with the second ring topological structure, and the second transmission speed is less than the first transmission speed.

11 Claims, 4 Drawing Sheets

(58) Field of Classification Search
USPC .................................. 331/57, 2, 46, 176, 183
See application file for complete search history.

(56) References Cited

U.S. PATENT DOCUMENTS

| | | | |
|---|---|---|---|
| 7,501,870 | B2 | 3/2009 | Choi |
| 7,872,510 | B2 | 1/2011 | Lee |
| 8,154,352 | B2 | 4/2012 | Ueno |
| 9,252,753 | B2 | 2/2016 | Lin |
| 9,270,256 | B2 | 2/2016 | Lee |
| 9,667,252 | B1 | 5/2017 | Lee et al. |
| 9,985,619 | B2 | 5/2018 | Lee et al. |
| 9,998,125 | B2 | 6/2018 | Balamurugan et al. |
| 10,241,537 | B2 | 3/2019 | Li et al. |
| 10,249,354 | B1 | 4/2019 | Lee et al. |
| 10,411,675 | B2 | 9/2019 | Kim et al. |
| 10,418,983 | B1 | 9/2019 | Lee |
| 10,458,857 | B2 | 10/2019 | Rachala et al. |
| 10,601,410 | B1 | 3/2020 | Satoh |
| 10,630,273 | B2 | 4/2020 | Tung et al. |
| 10,700,672 | B2 | 6/2020 | Savary et al. |
| 10,862,460 | B2 | 12/2020 | Kim et al. |
| 2004/0032300 | A1 | 2/2004 | Joordens |
| 2004/0189364 | A1 | 9/2004 | Lee |
| 2007/0018737 | A1 | 1/2007 | Drake |
| 2007/0090867 | A1 | 4/2007 | Kim |
| 2007/0241826 | A1 | 10/2007 | Ueno |
| 2008/0024182 | A1 | 1/2008 | Choi |
| 2008/0024233 | A1 | 1/2008 | Drake |
| 2009/0051443 | A1* | 2/2009 | Illegems .................. H03K 3/03 331/57 |
| 2009/0302912 | A1 | 12/2009 | Lee |
| 2012/0075025 | A1 | 3/2012 | Ueno |
| 2015/0171836 | A1 | 6/2015 | Lee |
| 2015/0372665 | A1* | 12/2015 | Tohidian .............. H03B 5/1228 331/57 |
| 2016/0006420 | A1 | 1/2016 | Lin |
| 2016/0241249 | A1 | 8/2016 | Balamurugan et al. |
| 2017/0117887 | A1 | 4/2017 | Lee et al. |
| 2017/0179956 | A1 | 6/2017 | Lee et al. |
| 2017/0194947 | A1 | 7/2017 | Wei |
| 2018/0358954 | A1 | 12/2018 | Kim et al. |
| 2018/0364752 | A1 | 12/2018 | Li et al. |
| 2019/0237127 | A1 | 8/2019 | Moon et al. |
| 2019/0257696 | A1 | 8/2019 | Rachala et al. |
| 2019/0280682 | A1 | 9/2019 | Lee |
| 2019/0348971 | A1 | 11/2019 | Kim et al. |
| 2020/0052681 | A1 | 2/2020 | Tung et al. |
| 2020/0136599 | A1 | 4/2020 | Savary et al. |
| 2020/0160902 | A1 | 5/2020 | Gans |
| 2020/0162066 | A1 | 5/2020 | Gans |

FOREIGN PATENT DOCUMENTS

| | | | |
|---|---|---|---|
| CN | 1956329 | A | 5/2007 |
| CN | 101141129 | A | 3/2008 |
| CN | 101409541 | A | 4/2009 |
| CN | 101629978 | A | 1/2010 |
| CN | 103684365 | A | 3/2014 |
| CN | 104270122 | A | 1/2015 |
| CN | 104716929 | A | 6/2015 |
| CN | 104734697 | A | 6/2015 |
| CN | 105099445 | A | 11/2015 |
| CN | 105281757 | A | 1/2016 |
| CN | 205385473 | U | 7/2016 |
| CN | 106374890 | A | 2/2017 |
| CN | 106888007 | A | 6/2017 |
| CN | 106941344 | A | 7/2017 |
| CN | 105281757 | B | 7/2018 |
| CN | 108768385 | A | 11/2018 |
| CN | 110266294 | A | 9/2019 |
| CN | 110830011 | A | 2/2020 |
| CN | 111103530 | A | 5/2020 |
| CN | 111147055 | A | 5/2020 |
| JP | 2006333184 | A | 12/2006 |
| KR | 20080009855 | A | 1/2008 |
| KR | 100998677 | B1 | 12/2010 |

OTHER PUBLICATIONS

Takashi Kusaga et al., "Four-State Ring Oscillator for Quadrature Signal Generation", ICSES 2008 International Conference on Singnals and Electronic Systems Krakow, Sep. 14-17, 2008, pp. 89-92.

Yyons2019, "Ring Oscillator Layout Design", https://maxbook118.com/html/2019/0901/6153212200002101,shtm, Sep. 2, 2019.

Zhang Tao et al., "Design of Low Noise Single Ended CMOS Ring Voltage controlled Oscillators", Microelectronics and Computing vol. 7 vol. 21 ISSN: 1000-7180, Jul. 31, 2004, p. 164-167.

Elad Alon, "Schematic and Layout Simulation Exercise", http://bwrcs.eecs.berkeley.edu/Classes/icdesign/eel41_f12/CurrentLabs/Lab%204.pdf, Sep. 23, 2009.

Zhou Shengming, "Integrated Circuit Design and Implementation Technology Based on ZENI", Xidian University Press, Oct. 31, 2013, p. 169, Figures 8-50.

* cited by examiner

OSCILLATION CIRCUIT AND CLOCK GENERATION CIRCUIT

CROSS-REFERENCE TO RELATED APPLICATIONS

This is a continuation of International Patent Application No. PCT/CN2021/107942 filed on Jul. 22, 2021, which claims priority to Chinese Patent Application No. 202011173759.1 filed on Oct. 28, 2020. The disclosures of these applications are hereby incorporated by reference in their entirety.

BACKGROUND

A Dynamic Random-Access Memory (DRAM) is a commonly used semiconductor storage device in computers, and is composed of many repetitive storage cells. In a DRAM Input/Output (I/O) circuit, a high-speed clock signal with a specific frequency is required for reading, writing and clock calibration.

SUMMARY

Embodiments of the application relate to, but are not limited to, an oscillation circuit and a clock generation circuit.

Embodiments of the application provide an oscillation circuit, which includes: a power supply generation module, configured to generate a positive temperature coefficient voltage based on a positive temperature coefficient current; and an oscillator, the positive temperature coefficient voltage serving as a power supply of the oscillator. The oscillator includes: a first ring topological structure, formed by a plurality of first inverters connected end to end and configured to transmit an oscillation signal at a first transmission speed; and a second ring topological structure, formed by a plurality of second inverters connected end to end and configured to transmit the oscillation signal at a second transmission speed. The first ring topological structure is electrically connected with the second ring topological structure, and the second transmission speed is less than the first transmission speed.

Embodiments of the application further provide a clock generation circuit, which includes: the oscillation circuit as described above; and a frequency adjusting module, connected with the oscillator in the oscillation circuit and configured to adjust a frequency of the oscillator.

BRIEF DESCRIPTION OF THE DRAWINGS

Exemplary descriptions are made on one or more embodiments by figures in the corresponding drawings corresponding thereto, and the exemplary descriptions do not constitute a limitation to the embodiments. Elements in the drawings having the same reference numerals are denoted by like elements, and unless otherwise stated, the figures in the drawings do not constitute a proportional limitation.

DETAILED DESCRIPTION

A ring oscillator may be used to generate a high-speed clock signal in the DRAM to meet the above requirements. However, the frequency of an oscillation signal generated by the ring oscillator is relatively low, so that it is difficult to meet the high-speed demand. In addition, the frequency and the duty cycle of the oscillation signal generated by the ring oscillator are easily affected by the process, power supply voltage, temperature, clock load, etc., resulting in deviation of the clock frequency and the duty cycle.

For example, an oscillator may generate a high-frequency clock signal, but the frequency of the oscillator deviates with different process corners, power supply voltages and temperature changes, that is, the current oscillator has a deviation problem of PVT, and the PVT refers to process, voltage and temperature. At present, the deviation problem of PVT is often solved by adding redundant test signals and delay units, or adjusting the charging current or each stage of load and the like, that is, by adding additional circuits. With the increase of the frequency of the oscillator, in order to improve the problems caused by PVT deviation, the redundancy of design and test is greatly increased.

Embodiments of the application provide an oscillation circuit, which may reduce the impact of PVT deviation on the frequency of an oscillator and improve the stability of the frequency of the oscillator.

In order to enable purposes, technical solutions and advantages of the embodiments of the application to be more clearly, various embodiments of the application are described in detail below in combination with the drawings. However, it can be understood by those of ordinary skill in the art that: in order to enable a reader to understand the application better, many technical details are provided in the various embodiments of the application. But, even if these technical details and a variety of changes and modifications based on the various embodiments below do not exist, the technical solutions to be protected by the application may also be realized.

Figure 1:
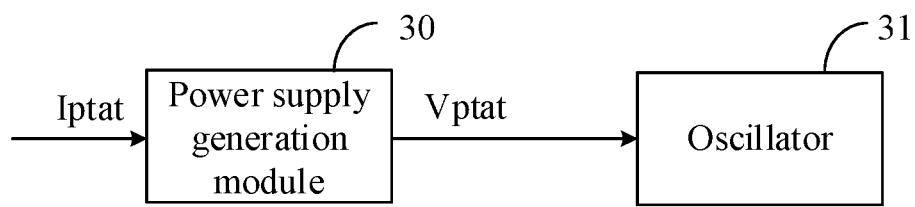
FIG. 1 is a functional module block diagram of an oscillation circuit according to an embodiment of the application.
Figure 2:
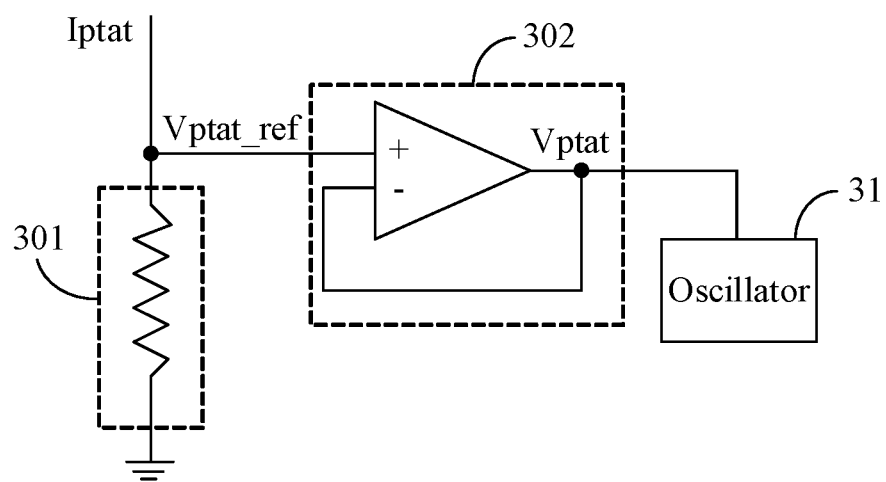
FIG. 2 is a schematic diagram of a circuit structure of an oscillation circuit according to an embodiment of the application.
Figure 3:
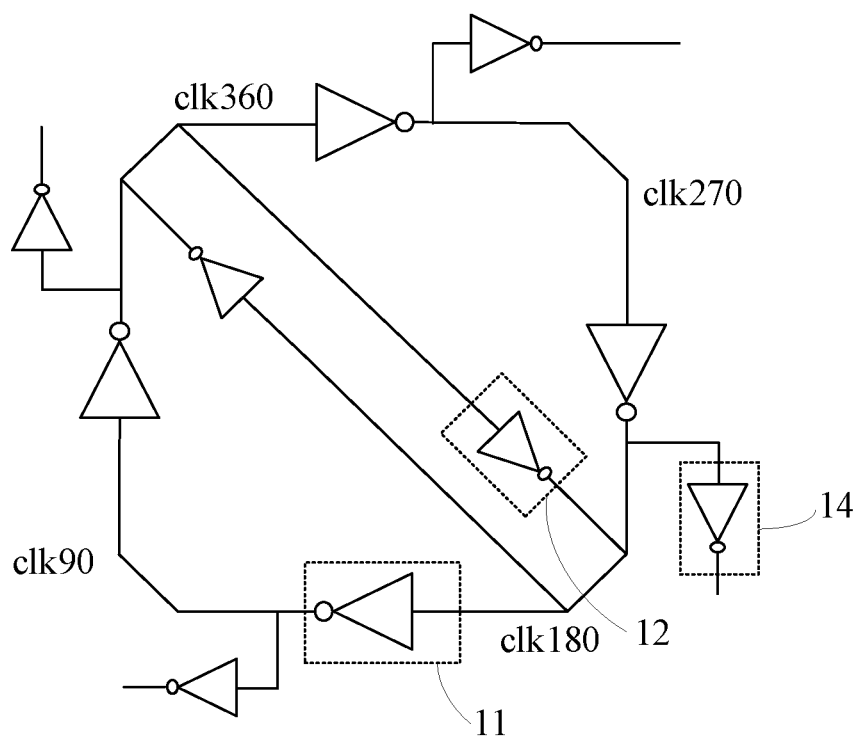
FIG. 3 is a schematic diagram of a circuit structure of an oscillator in an oscillation circuit according to an embodiment of the application.

FIG. 1 is a functional block diagram of an oscillation circuit according to an embodiment of the application. FIG. 2 is a schematic diagram of a circuit structure of an oscillation circuit according to an embodiment of the application. FIG. 3 is a schematic diagram of a circuit structure of an oscillator in an oscillation circuit according to an embodiment of the application.

Referring to FIG. 1 to FIG. 3, an oscillation circuit includes: a power supply generation module 30, configured to generate a positive temperature coefficient voltage Vptat based on a positive temperature coefficient current Iptat; and an oscillator 31, the positive temperature coefficient voltage Vptat serving as a power supply of the oscillator. The oscillator 31 includes: a first ring topological structure, formed by a plurality of first inverters 11 connected end to end and configured to transmit an oscillation signal at the first transmission speed; and a second ring topological structure, formed by a plurality of second inverters 12 connected end to end and configured to transmit the oscillation signal at the second transmission speed. The first ring topological structure is electrically connected with the second ring topological structure, and the second transmission speed is less than the first transmission speed.

The transmission speed refers to a speed of an oscillation signal from high level to low level or from low level to high level. When the transmission speed is slower, the transmission time is longer, and thus the period of the oscillation signal is longer, and the frequency is lower.

In an embodiment of the application, an output of the power supply generation module 30 serves as a power supply terminal Vcc, and is connected to the first inverters 11 and the second inverters 12.

Since the carrier mobility decreases as the temperature increases, the frequency of the oscillator 31 decreases accordingly when the temperature increases. In some embodiments of the application, the power supply of the oscillator 31 does not use an external power supply, but uses the positive temperature coefficient voltage Vptat generated by the power supply generation module 30 as the power supply. When the temperature increases, the positive temperature coefficient voltage Vptat increases, so that the charging and discharging current of the oscillator 31 at high temperature may be enhanced to compensate for the influence of the carrier change of the oscillator 31, and thus to compensate for the deviation of the temperature on the frequency of the oscillator 31, so that the frequency of the oscillator 31 remains stable with the increase of the temperature. Therefore, at high temperature, the positive temperature coefficient voltage Vptat may compensate the frequency of the oscillator 31, which reduces the influence of temperature on the frequency.

Correspondingly, when the temperature decreases, the carrier mobility decreases, and thus the frequency of the oscillator 31 increases. When the temperature decreases, the positive temperature coefficient voltage Vptat also decreases, so that the charging and discharging current of the oscillator 31 at low temperature may be reduced to compensate for the influence of the carrier change of the oscillator 31, and thus to compensate for the deviation of the temperature on the frequency of the oscillator 31, so that the frequency of the oscillator 31 still remains stable with the decrease of the temperature, and the influence of temperature on the frequency is reduced. Therefore, at low temperature, the positive temperature coefficient voltage Vptat may compensate the frequency of the oscillator 31 and reduce the influence of temperature on the frequency.

Moreover, since the positive temperature coefficient voltage Vptat is generated by an internal circuit of a chip, it is not affected by the changes of an external power supply, and the influence of voltage change on the frequency of the oscillator may also be reduced. Therefore, in the oscillation circuit provided in the embodiments of the application, the frequency of the oscillator is less affected by the changes of temperature and voltage of the external power supply.

In some embodiments of the application, the positive temperature coefficient current Iptat may be generated by an on-chip bandgap reference circuit. For example, Iptat=delta Vbe/R1, where Vbe is voltage between the base and the emitter of a transistor, delta Vbe is a voltage difference of two transistors Vbe, and is proportional to the temperature, R1 is equivalent resistance of the transistor, and has a positive temperature coefficient, but the temperature coefficient of R1 is much smaller than delta Vbe. Therefore, as the temperature increases, Iptat increases, and thus it is called positive temperature coefficient current Iptat. It is to be noted that in other embodiments, the positive temperature coefficient current may also be generated by other proper circuits.

In an embodiment of the application, referring to FIG. 2, the power supply generation module 30 (referring to FIG. 1) includes: a load 301, configured to generate a positive temperature coefficient reference voltage Vptat_ref based on the positive temperature coefficient current Iptat; and a voltage output unit 302, connected with the load 301 and configured to receive the positive temperature coefficient reference voltage Vptat_ref and generate the positive temperature coefficient voltage Vptat.

In an embodiment of the application, the load 301 may be a resistor of positive temperature coefficient, that is, as the temperature increases, the resistance of the load 301 increases. Since the temperature coefficient of a resistor R1 and the temperature coefficient of the load 301 will cancel, the positive temperature coefficient reference voltage Vptat_ref generated based on the load 301 is further guaranteed to have positive temperature coefficient characteristics similar to delta Vbe.

In an embodiment of the application, the load 301 may include a resistor R, the positive temperature coefficient current Iptat is current flowing through the resistor R. One end of the resistor R is grounded, and voltage of the other end of the resistor R is the positive temperature coefficient reference voltage Vptat. The resistor R is a positive temperature coefficient resistor.

The voltage output unit 302 may include a buffer or a linear regulator, and the linear regulator may be a Low Dropout Regulator (LDO). In the embodiments of the application, the voltage output unit 302 is the linear regulator as an example.

The positive temperature coefficient reference voltage Vptat_ref passes through the voltage output unit 302, and a positive temperature coefficient voltage Vptat with driving capability is generated. The positive temperature coefficient voltage Vptat is used as a power supply end Vcc to drive the first inverters 11 and the second inverters 12.

In the embodiments of the application, when the temperature increases, the high temperature causes the frequency of the oscillator to decrease, and thus the positive temperature coefficient voltage Vptat increases, and the driving capability of the positive temperature coefficient voltage Vptat to the first inverters 11 and the second inverters 12 is enhanced to increase the charging and discharging current of the first inverters 11 and the second inverters 12, so as to compensate for the influence of the temperature increasing on the frequency of the oscillator. When the temperature decreases, the low temperature causes the frequency of the oscillator to increase; and thus the positive temperature coefficient voltage Vptat decreases, and the driving capability of the positive temperature coefficient voltage Vptat to the first inverters 11 and the second inverters 12 is weakened to reduce the charging and discharging current of the first inverters 11 and the second inverters 12, so as to compensate for the influence of the temperature decreasing on the frequency of the oscillator. Therefore, the frequency of the oscillator does not depend on the changes of temperature.

The positive temperature coefficient reference voltage Vptat_ref is related to the positive temperature coefficient current. When the temperature remains unchanged, the positive temperature coefficient current Iptat remains unchanged. Even if the external power supply fluctuates, the positive temperature coefficient reference voltage Vptat_ref still remains unchanged, so that the positive temperature coefficient voltage Vptat also remains unchanged. That is, at a certain temperature, the positive temperature coefficient voltage Vptat is hardly varied with the change of the external power supply, and thus the influence of the external power supply on the frequency of the oscillator is reduced.

Therefore, the embodiments of the application can reduce the influence of PVT deviation on the frequency of the oscillator.

The oscillator will be described below in detail in combination with the drawings.

In an embodiment of the application, the number of the first inverters 11 is N, and N is an integer greater than or equal to 4. Correspondingly, the number of the second inverters 12 is M, and M is an integer greater than or equal to 2.

An input terminal of each first inverter 11 is denoted as a first node, and a first ring topological structure has N first nodes. An input terminal of each second inverter 12 is denoted as a second node, and a second ring topological structure has M second nodes. At least two second nodes are electrically connected with the corresponding number of first nodes.

In an embodiment of the application, each first node has different phases on an oscillation path of the first ring topological structure. By taking the number of four first inverters 11 as an example, the four first nodes on the oscillation path have a first phase clk90, a second phase clk180, a third phase clk270 and a fourth phase clk360 respectively, and the four first nodes form an oscillation cycle of 360 degrees. that is, each first node corresponds to a phase displacement of 90 degrees. Correspondingly, the second ring topological structure has two second nodes, one second node is electrically connected with a first node having the second phase clk180, and the other second node is electrically connected with a first node having the fourth phase clk360, that is, the second ring topological structure is configured to invert the two first nodes.

In an embodiment of the application, the second transmission speed is less than the first transmission speed, and the second transmission speed is greater than or equal to 0.5 times of the first transmission speed.

Figure 4:
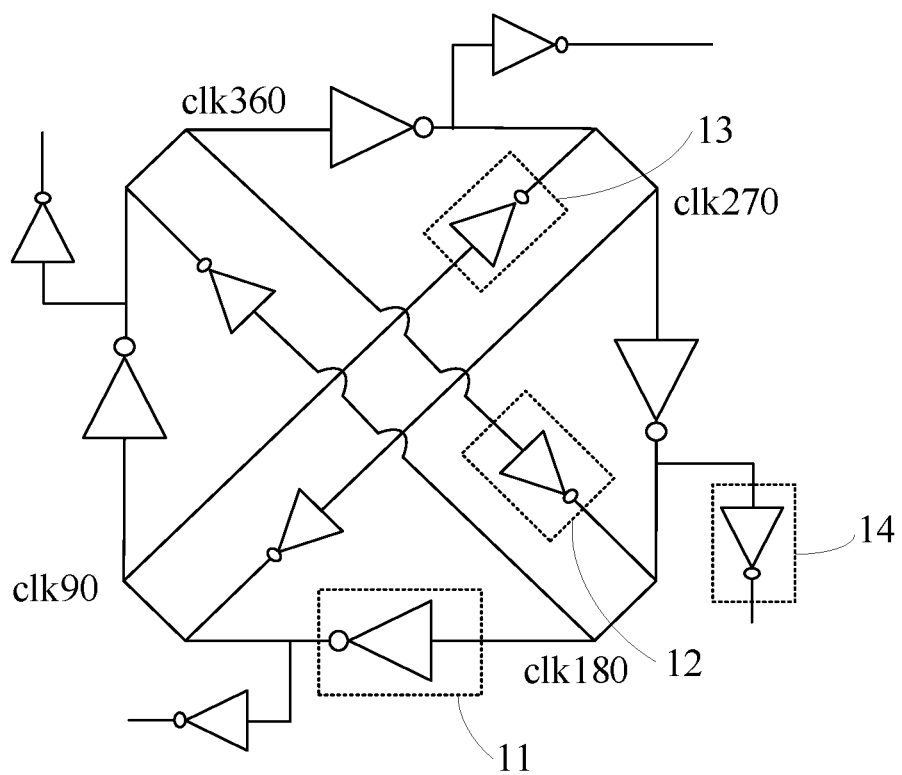
FIG. 4 is a schematic diagram of another circuit structure of an oscillator in an oscillation circuit according to an embodiment of the application.

In an embodiment of the application, referring to FIG. 4, the oscillator may further include a third ring topological structure, formed by a plurality of third inverters 13 connected end to end and configured to transmit the oscillation signal at a third transmission speed. The first ring topological structure is electrically connected with the third ring topological structure, and the third transmission speed is less than the first transmission speed.

The output of the power supply generation module 30 is also used as the power supply terminal Vcc of the third inverters 13 to drive the third inverters 13.

The first ring topological structure serves as an outer ring topological structure, and the second ring topological structure and the third ring topological structure serve as inner ring topological structures. The number of inverters in different ring topological structures may be as follows: the number of the first inverters 11 is U, U being an integer greater than or equal to 4; the number of the second inverters 12 is V, V being is an integer greater than or equal to 2; and the number of the third inverters 13 is W, W being is an integer greater than or equal to 2.

In an embodiment of the application, an input terminal of each first inverter 11 is denoted as a first node, and the first ring topological structure has U first nodes. An input terminal of each second inverter 12 is denoted as a second node, and the second ring topological structure has V second nodes. An input terminal of each third inverter 13 is denoted as a third node, and the third ring topological structure has W third nodes. At least two second nodes are electrically connected with the corresponding number of first nodes, and at least two third nodes are electrically connected with the corresponding number of first nodes.

In an embodiment of the application, the first node corresponding to the second node is different from the first node corresponding to the third node. The second nodes correspond to first nodes having the second phase clk180 and the fourth phase clk360, and the third nodes correspond to the first nodes having the first phase clk90 and the third phase clk270. Therefore, it is conducive to making the oscillation signals of different first nodes to have more inversion times per unit time, so as to improve the frequency of the transmitted oscillation signal, thereby improving the transmission speed of the oscillation signal.

In an embodiment of the application, the second transmission speed is less than the first transmission speed, the second transmission speed is greater than or equal to 0.5 times of the first transmission speed, and the third transmission speed is equal to the second transmission speed.

In an embodiment of the application, the oscillator further includes a buffer inverter 14, having an input terminal of the buffer inverter 14 for receiving an oscillation signal, and an output terminal for outputting a clock signal. The buffer inverter 14 is configured to isolate a back-end circuit (such as a duty cycle calibration circuit) of the oscillator as a load from the impact on the frequency of the oscillation signal, so that the oscillator maintains a relatively high multiplexing rate.

In an embodiment of the application, the transmission speed of the buffer inverter 14 is adjustable. An adjustable transmission speed of the buffer inverter 14 may be realized by adjusting the pull-up capability and/or pull-down capability thereof.

When the pull-up capability of the buffer inverter 14 increases, the pull-down capability of the buffer inverter 14 decreases. When the pull-up capability of the buffer inverter 14 decreases, the pull-down capability of the buffer inverter 14 increases.

The pull-up capability refers to the capability to clamp a falling edge signal, a low-level signal and a rising edge signal into high-level signals, and the pull-down capability refers to the capability to clamp a rising edge signal, a high-level signal and a falling edge signal into low-level signals. When the pull-up capability increases and the pull-down capability decreases, the duty cycle of the clock signal output by the buffer inverter 14 increases. When the pull-up capability decreases and the pull-down capability increases, the duty cycle of the clock signal output by the buffer inverter 14 decreases. That is, by controlling the pull-up capability and pull-down capability of the buffer inverter 14 to change differently, an adjustable duty cycle of the clock signal may be realized, so that the duty cycle of the clock signal meets the preset requirements. It is to be noted that, each first node may be connected with a buffer inverter 14, or a buffer inverter 14 may be connected in series between each first node and the back-end circuit, to avoid the influence of the back-end circuit on the frequency of the oscillation signal, so as to ensure that each stage of the first inverter 11 of the oscillator has a high load matching degree, and thus the frequency of the oscillation signal of the oscillator is more stable.

In an embodiment of the application, the buffer inverter 14 may include: a first P-channel Metal Oxide Semiconductor (PMOS) group, including H PMOSs, sources of the H PMOSs being connected to the power supply terminal Vcc; a first N-channel Metal Oxide Semiconductor (NMOS) group, including H NMOSs, sources of the H NMOSs being connected to a ground terminal Vss; a 0th PMOS, a source of the 0th PMOS being connected to the drains of the H PMOSs; and a 0th NMOS, a source of the 0th NMOS being connected to drains of the H NMOSs, a drain of the 0th PMOS being connected with the drain of the 0th NMOS as the output terminal of the buffer inverter 14, and a gate of the 0th PMOS being connected with the gate of the 0th NMOS as the input terminal of the buffer inverter 14. The gates of the H PMOSs and the gates of the H NMOSs are controlled by a duty cycle adjustment coding group.

The duty cycle adjustment coding group may be sent by a duty cycle adjustment module (not shown in the figures). The PMOS and PMOS transistors all are PMOS transistors.

In an embodiment of the application, the number of the conducting PMOS transistors in the first PMOS group and/or the number of the conducting NMOS transistors in the first NMOS group may be controlled by controlling the parameters of the duty cycle adjustment coding group, so as to adjust the pull-up capability and/or pull-down capability of the buffer inverters 14.

It is to be noted that, the PMOS transistor and the NMOS transistor have different conduction voltages. When a first adjustment code in the duty cycle adjustment coding group is at a high level, the first NMOS transistor is turned on and the first PMOS transistor is turned off. When the first regulation code is at a low level, the first NMOS transistor is turned off and the first PMOS transistor is turned on.

Since one duty cycle adjustment code controls the first PMOS group and the first NMOS group at the same time, the number of the NMOS transistors in the first NMOS group is less when the number of the conducting PMOS transistors in the first PMOS group is larger. When the number of the conducting PMOS transistors in the first PMOS group is larger, the load value of the first PMOS group is smaller, and the charging rate of the buffer inverter 14 is faster, and thus the pull-up capability of the buffer inverter 14 is stronger. Correspondingly, when the number of the conducting NMOS transistors in the first NMOS group is smaller, the load value of the first NMOS group is larger, and the discharging rate of the buffer inverter 14 is slower, and thus the pull-down capability of the buffer inverter 14 is weaker. In this way, when the number of the conducting PMOS transistors is large and the number of the conducting NMOS transistors is small, the duty cycle of the clock signal output by the buffer inverter 14 increases.

Correspondingly, when the number of the conducting PMOS transistors is small and the number of the conducting NMOS transistors is large, the pull-up capability of the buffer inverter 14 decreases and the pull-down capability increases, and thus the duty cycle of the clock signal output by the buffer inverter 14 decreases.

In order to ensure the normal operation of the 0th PMOS and the 0th NMOS, an initial PMOS transistor and an initial NMOS transistor are further provided. The source of the initial PMOS transistor is connected to the power supply terminal, the drain of the initial PMOS transistor is connected to the source of the 0th PMOS, and the gate of the initial PMOS transistor is connected to the ground terminal. That is, the initial PMOS transistor is in the conductive state. The source of the initial NMOS transistor is connected to the ground terminal, the drain of the initial NMOS transistor is connected to the source of the 0th NMOS, and the gate of the initial NMOS transistor is connected to the power supply terminal. That is, the initial NMOS transistor is in the conductive state.

In an embodiment of the application, the first transmission speed of the first inverters 11 is adjustable. An adjustable first transmission speed of the first inverter 11 may be realized by adjusting the pull-up capability and/or pull-down capability thereof.

When the pull-up capability of the first inverter 11 increases, the pull-down capability of the first inverter 11 increases. When the pull-up capability of the first inverter 11 decreases, the pull-down capability of the first inverter 11 decreases. Therefore, the frequency of the oscillation signal output by the oscillator may be adjusted, to obtain an oscillation signal meeting the preset frequency requirement.

In an embodiment of the application, the first inverter 11 is connected to the power supply terminal, and the second inverter 12 is connected to the power supply terminal. The first inverter 11 includes: a third PMOS group, including I PMOSs, the sources of the I PMOSs being connected to the power supply terminal; a third NMOS group, including I NMOSs, the sources of the I NMOSs being connected to a ground terminal; a second PMOS, the source of the second PMOS being connected to the drains of the I PMOSs; and a second NMOS, the source of the second NMOS being connected to the drains of the I NMOSs, the drain of the second PMOS being connected with the drain of the second NMOS as an output terminal of the first inverter 11, and the gate of the second PMOS is connected with the gate of the second NMOS as an input terminal of the first inverter 11. The gates of the I PMOSs are controlled by a first reverse adjusting coding group, the gates of the I NMOSs are controlled by a first forward adjusting coding group. The adjustable first transmission speed is achieved by changing the first reverse adjusting coding group and/or the first forward adjusting coding group. In an embodiment of the application, the number of the conducting PMOS transistors in the third PMOS group may be controlled by controlling the parameters of the first reverse adjusting coding group, so as to adjust the pull-up capability of the first inverter 11, and/or, the number of the conducting NMOS transistors in the third NMOS group may be controlled by controlling the parameters of the first forward adjusting coding group, so as to adjust the pull-down capability of the first inverter 11.

It is to be noted that the potential of the first reverse adjusting coding group is opposite to that of the first forward adjusting coding group, that is, potential inversion. When a first forward adjusting coding is at a high level and a first reverse adjusting coding is at a low level, the first PMOS transistor in the third PMOS group is turned on and the first NMOS transistor in the third NMOS group is turned on. Correspondingly, when the first forward adjusting coding is at a low level and the first reverse adjusting coding is at a high level, the first PMOS transistor in the third PMOS group is turned off and the first NMOS transistor in the third NMOS group is turned off.

That is, when the number of the conducting PMOS transistors in the third PMOS group is larger, the number of the conducting NMOS transistors in the third NMOS group is larger, and thus the pull-up capability and pull-down capability of the first inverter 11 are enhanced, and the frequency of the oscillation signal output by the first inverter 11 increases. Correspondingly, when the number of the conducting PMOS transistors in the third PMOS group is larger, the number of the conducting NMOS transistors in the third NMOS group is larger, and thus the pull-up capability and pull-down capability of the first inverter 11 are weakened, and the frequency of the oscillation signal output by the first inverter 11 decreases.

Moreover, the first inverter 11 has an initial PMOS transistor configured to ensure that the second PMOS is in an operating state and an initial NMOS transistor configured to ensure that the second NMOS is in an operating state.

In an embodiment of the application, the first transmission speed of the second inverter 12 is adjustable. An adjustable transmission speed of the second inverter 12 may be realized by adjusting the pull-up capability and/or pull-down capability thereof.

When the pull-up capability of the second inverter 12 increases, the pull-down capability of the second inverter 12 increases. When the pull-up capability of the second inverter 12 decreases, the pull-down capability of the second inverter 12 decreases.

The second inverter 12 includes: a fifth PMOS group, including L PMOSs, the sources of the L PMOSs being connected to a power supply terminal; a fifth NMOS group 122, including L NMOSs, the sources of the L NMOSs being connected to a ground terminal; a fourth PMOS, the source of the fourth PMOS being connected to the drains of the L PMOSs; and a fourth NMOS, the source of the fourth NMOS being connected to the drains of the L NMOSs, the drain of the fourth PMOS being connected to the drain of the fourth NMOS as an output terminal of the second inverter 12, and the gate of the fourth PMOS being connected to the gate of the fourth NMOS as an input terminal of the second inverter 12. The gates of the L PMOS transistors are controlled by a second reverse adjusting coding group, and the gates of the L NMOSs are controlled by a second forward adjusting coding group. The adjustable first transmission speed is achieved by changing the second reverse adjusting coding group and/or the second forward adjusting coding group.

In an embodiment of the application, the number of the conductive PMOS transistors in the fifth PMOS group may be controlled by controlling the parameters of the second reverse adjusting coding group, so as to adjust the pull-up capability of the second inverter 12, and/or, the number of the conductive NMOS transistors in the fifth NMOS group may be controlled by controlling the parameters of the second forward adjusting coding group, so as to adjust the pull-down capability of the second inverter 12.

It is to be noted that the potential of the second reverse adjusting coding group is opposite to that of the second forward adjusting coding group. When a second forward adjusting coding is at a high level and a second reverse adjusting coding is at a low level, the first PMOS transistor in the fifth PMOS group is turned on and the first NMOS transistor in the fifth NMOS group is turned on. Correspondingly, when the second forward adjusting coding is at a low level and the first reverse adjusting coding is at a high level, the first PMOS transistor in the fifth PMOS group is turned off and the first NMOS transistor in the fifth NMOS group is turned off.

That is, when the number of the conducting PMOS transistors in the fifth PMOS group is larger, the number of the conducting NMOS transistors in the fifth NMOS group is larger, and thus the pull-up capability and pull-down capability of the second inverter 12 are enhanced, and the frequency of the oscillation signal output by the second inverter 12 increases. Correspondingly, when the number of the conducting PMOS transistors in the fifth PMOS group is smaller, the number of the conducting NMOS transistors in the fifth NMOS group is smaller, and thus the pull-up capability and pull-down capability of the second inverter 12 are weakened, and the frequency of the oscillation signal output by the second inverter 12 decreases.

Moreover, the second inverter 12 has an initial PMOS transistor configured to ensure that the fourth PMOS is in an operating state and an initial NMOS transistor configured to ensure that the fourth NMOS is in an operating state.

In an embodiment of the application, the first inverter 11 includes a plurality of first sub-inverters, where input terminals of the plurality of first sub-inverter are electrically connected, and output terminals of the plurality of first sub-inverter are electrically connected. Therefore, it is beneficial to control the wiring lengths between other elements and the first sub-inverter in design of oscillator layout to be close or equal to each other, so that the oscillator layout has good symmetrical balance, and thus each key node of the oscillator in the layout has a relatively high load matching degree, and the delay of each stage of inverter is equal. In addition, it is also beneficial to making the wiring lengths between other elements and the first sub-inverter shorter, so as to reduce the parasitic resistance and parasitic capacitance of the connecting lines, such that the oscillator has good performance.

The number of the first sub-inverters is even, which is beneficial for better symmetrical balance in design of the layout.

In an embodiment of the application, the second inverter 12 includes a plurality of second sub-inverters, where input terminals of the plurality of second sub-inverter are electrically connected, and output terminals of the plurality of second sub-inverter are electrically connected. Therefore, the symmetrical balance of the oscillator layout is further improved.

The number of second sub-inverters is equal to the number of first sub-inverters. Therefore, the symmetrical balance of the oscillator layout is further improved, and thus an oscillator with better performance is obtained.

In an embodiment of the application, the oscillation circuit may compensate the frequency of the oscillator for temperature change and external power supply voltage change, to reduce influence of PVT deviation on the frequency of the oscillator. That is, when the temperature increases, the positive temperature coefficient voltage increases, and the charging and discharging current of the oscillator is correspondingly increased to compensate for the change of mobility decrease caused by the increasing temperature, so as to reduce the deviation of the frequency of the frequency. When the temperature decreases, the positive temperature coefficient voltage decreases, and the charging and discharging current of the oscillator is reduced correspondingly to compensate for the change of mobility increase caused by the decreasing temperature, so as to reduce the deviation of the frequency of the oscillator. Moreover, since the positive temperature coefficient voltage is not influenced by changes of the external power supply, the influence of the frequency of the oscillator affected by the change of the external power supply is also reduced. Therefore, the frequency of the oscillator in the oscillation circuit provided in the embodiments of the application has good stability.

Moreover, in an embodiment of the application, compared with transmission of the oscillation signal only through the first ring topological structure, the setting of the second ring topological structure may increase the inversion times of the oscillation signal at electrical connection nodes in unit time, so as to obtain a high-speed oscillation signal.

Embodiments of the application further provide a clock generation circuit, which includes an oscillation circuit provided in any one of the above embodiments. The clock generation circuit will be described in detail with reference to the drawings, and same or corresponding parts with the above embodiments may refer to descriptions of the above embodiments, and will not be elaborated below.

The clock generation circuit may include: an oscillation circuit, including a power supply generation module and an oscillator; and a frequency adjusting module, connected with the oscillator and configured to adjust a frequency of the oscillator.

The frequency adjusting module is configured to adjust the frequency of the oscillation signal of the oscillator by adjusting a first transmission speed/or a second transmission speed.

It should be understood that the frequency adjusting module may be configured to adjust the frequency of the oscillation signal of the oscillator by adjusting the first transmission speed and the second transmission speed, that is, the frequency adjusting module adjusts the frequency of the oscillation signal of the oscillator by adjusting a first transmission speed of the first inverter and a second transmission speed of the second inverter. Alternatively, the frequency adjusting module may further be configured to adjust the frequency of the oscillation signal of the oscillator by adjusting one of the first transmission speed or the second transmission speed, and correspondingly, the frequency adjusting module adjusts the frequency of the oscillation signal of the oscillator by adjusting the first transmission speed of the first inverter, or, the frequency adjusting module adjusts the frequency of the oscillation signal of the oscillator by adjusting the second transmission speed of the second inverter.

In an embodiment of the application, as an example, the frequency adjusting module adjusts both the first transmission speed and the second transmission speed. In the embodiment of the application, the frequency adjusting module is connected with the first inverter and the second inverter, and the frequency adjusting module may be configured to change the pull-up capability of the first inverter by adjusting the first reverse adjusting coding group, and change the pull-down capability of the first inverter by adjusting the first forward adjusting coding group, so as to adjust the first transmission speed of the first inverter, thereby to adjust the frequency of the oscillation signal of the oscillator. Correspondingly, the frequency adjusting module may be configured to change the pull-up capability of the second inverter by adjusting the second reverse adjusting coding group, and change the pull-down capability of the second inverter by adjusting the second forward adjusting coding group, so as to adjust the second transmission speed of the second inverter is adjusted, thereby to adjust the frequency of the oscillation signal of the oscillator.

In other embodiments, the frequency adjusting module may be connected with the first inverter or the second inverter, and may be configured to only change the pull-up capability or the pull-down capability of the first inverter, or, only change the pull-up capability or the pull-down capability of the second inverter.

In an embodiment of the application, the clock generation circuit further includes a duty cycle adjusting module, connected with the oscillator and configured to adjust the duty cycle of the oscillation signal. The oscillator may include a buffer inverter, and the buffer inverter is configured to receive an oscillation signal and output a clock signal. The duty cycle adjusting module is connected with the buffer inverter, and the duty cycle adjusting module is configured to adjust the pull-up capability and pull-down capability of the buffer inverter by adjusting the parameters of a duty cycle adjusting coding group, so that the pull-up capability and pull-down capability of the buffer inverter change towards different regions, and thus the effect of adjusting the duty cycle of the clock signal is realized.

In some embodiments of the application, the duty cycle adjusting module is further connected with the first inverter and/or the second inverter, and configured to adjust the duty cycle of the oscillation signal output by the first inverter and/or the second inverter, so that the oscillation signal output by the oscillator meets a preset duty cycle requirement.

In an embodiment of the application, the clock generation circuit may reduce the influence of the clock load on the frequency and the duty cycle of the high-speed clock signal, so that a clock signal meeting the preset frequency requirement and the preset duty cycle requirement is output. Moreover, the clock signal generated by the clock generation circuit has high frequency stability, and is less likely to be affected by fluctuations of temperature and external power supply.

It can be understood by those of ordinary skill in the art that, the above various implementation modes are specific embodiments for realizing the application, while in actual application, various changes may be made on the embodiments in forms and details without deviating from the spirit and the scope of the application. Those skilled in the art may implement respective variations and modifications without departing from the spirit and scope of the application, and thus the scope of protection of the application should be subject to the scope defined by the claims.

The embodiment of the application provides an oscillation circuit and a clock generation circuit. The oscillation circuit includes: a power supply generation module, configured to generate a positive temperature coefficient voltage based on a positive temperature coefficient current; and an oscillator, the positive temperature coefficient voltage serving as a power supply of the oscillator. The oscillator includes: a first ring topological structure, formed by a plurality of first inverters connected end to end and configured to transmit an oscillation signal at the first transmission speed; and a second ring topological structure, formed by a plurality of second inverters connected end to end and configured to transmit the oscillation signal at the second transmission speed. The first ring topological structure is electrically connected with the second ring topological structure, and the second transmission speed is less than the first transmission speed.

In the embodiments of the application, the power supply generation module is configured to generate a positive temperature coefficient voltage based on the positive temperature coefficient current, where the positive temperature coefficient voltage serves as a power supply of the oscillator, so that the power supply may compensate for the influence of temperature on the frequency of the oscillator to reduce the deviation of the frequency of the oscillator generated as PVT changes, and thus the frequency stability of the oscillator in the oscillation circuit is improved. Compared with transmission of the oscillation signal only through the first ring topological structure, since the second transmission speed of the second ring topological structure is less than the first transmission speed of the first ring topological structure, the setting of the second ring topological structure may make the oscillation signal to be inversed more times in unit time, and thus a high-speed oscillation signal is obtained.

What is claimed is:

1. An oscillation circuit, comprising:
a power supply generation module, configured to generate a positive temperature coefficient voltage based on a positive temperature coefficient current; and an oscillator, the positive temperature coefficient voltage serving as a power supply of the oscillator;

the oscillator comprising:

a first ring topological structure, formed by a plurality of first inverters connected end to end, and configured to transmit an oscillation signal at a first transmission speed;

a second ring topological structure, formed by a plurality of second inverters connected end to end, and configured to transmit the oscillation signal at a second transmission speed;

wherein the first ring topological structure is electrically connected with the second ring topological structure, and the second transmission speed is less than the first transmission speed, wherein the number of the first inverters is N, N being an integer greater than or equal to 4, and the number of the second inverters is M, M being an integer greater than or equal to 2, wherein an input terminal of each first inverter is denoted as a first node, and the first ring topological structure has N first nodes; and wherein an input terminal of each second inverter is recorded as a second node, and the second ring topological structure has M second nodes, wherein at least two second nodes are electrically connected with a corresponding number of the first nodes, wherein the second transmission speed is greater than or equal to 0.5 times of the first transmission speed, and the oscillation circuit further comprises:

a third ring topological structure, formed by a plurality of third inverters connected end to end, and configured to transmit the oscillation signal at a third transmission speed, wherein the first ring topological structure is electrically connected with the third ring topological structure, and the third transmission speed is less than or equal to the first transmission speed.

2. The oscillation circuit according to claim 1, wherein an output of the power supply generation module serves as a power supply terminal, and is connected to the first inverters and the second inverters.

3. The oscillation circuit according to claim 1, wherein the power supply generation module comprises:

a load, configured to generate a positive temperature coefficient reference voltage based on the positive temperature coefficient current; and a voltage output unit, connected with the load and configured to receive the positive temperature coefficient reference voltage and generate the positive temperature coefficient voltage.

4. The oscillation circuit according to claim 3, wherein the load comprises a resistor, and the positive temperature coefficient current is a current flowing through the resistor, wherein one end of the resistor is grounded, and a voltage at the other end of the resistor is the positive temperature coefficient reference voltage.

5. The oscillation circuit according to claim 3, wherein the voltage output unit comprises a buffer or a linear regulator.

6. The oscillation circuit according to claim 1, wherein the number of the first inverters is U, U being an integer greater than or equal to 4, the number of the second inverters is V, V being an integer greater than or equal to 2, and the number of the third inverters is W, W being an integer greater than or equal to 2.

7. The oscillation circuit according to claim 6, wherein an input terminal of each first inverter is denoted as a first node, and the first ring topological structure has U first nodes; wherein an input terminal of each second inverter is denoted as a second node, and the second ring topological structure has V second nodes; and wherein an input terminal of each third inverter is denoted as a third node, and the third ring topological structure has W third nodes, wherein at least two second nodes are electrically connected with a corresponding number of the first nodes, and at least two third nodes are electrically connected with a corresponding number of the first nodes.

8. The oscillation circuit according to claim 7, wherein the second transmission speed is less than the first transmission speed, the second transmission speed is greater than or equal to 0.5 times of the first transmission speed, and the third transmission speed is equal to the second transmission speed.

9. The oscillation circuit according to claim 1, wherein the third ring topology structure is comprised in the oscillator.

10. The oscillation circuit according to claim 1, wherein the oscillator further comprises:

a buffer inverter, having an input terminal for receiving the oscillation signal, and an output terminal for outputting a clock signal.

11. A clock generation circuit, comprising:

the oscillation circuit according to claim 1; and a frequency adjusting module, connected with the oscillator in the oscillation circuit and configured to adjust a frequency of the oscillator.

* * * * *